United States Patent
Gatzemeier et al.

(10) Patent No.: US 7,116,584 B2
(45) Date of Patent: Oct. 3, 2006

(54) MULTIPLE ERASE BLOCK TAGGING IN A FLASH MEMORY DEVICE

(75) Inventors: Scott N. Gatzemeier, Boise, ID (US); Mitch Liu, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 10/636,179

(22) Filed: Aug. 7, 2003

(65) Prior Publication Data

US 2005/0033904 A1 Feb. 10, 2005

(51) Int. Cl.
*G06F 9/312* (2006.01)
*G06F 12/16* (2006.01)

(52) U.S. Cl. .................... 365/185.33; 365/185.29; 365/218; 711/166; 711/156; 711/103

(58) Field of Classification Search .............. 711/5
See application file for complete search history.

(56) References Cited

U.S. PATENT DOCUMENTS

| | | | | |
|---|---|---|---|---|
| 6,055,184 A | * | 4/2000 | Acharya et al. | 365/185.11 |
| 6,529,416 B1 | * | 3/2003 | Bruce et al. | 365/185.33 |
| 6,577,540 B1 | | 6/2003 | Choi | |
| 6,643,184 B1 | | 11/2003 | Pio | |
| 6,735,119 B1 | * | 5/2004 | Mihara | 365/185.18 |

* cited by examiner

*Primary Examiner*—B. James Peikari
(74) *Attorney, Agent, or Firm*—Leffert Jay & Polglaze, P.A.

(57) ABSTRACT

A plurality of memory devices can be erase block tagged in parallel by issuing an erase pulse to memory devices that do not have memory blocks with erase block latches that indicate the block is erased. The status of the memory block is read after the erase pulse. If there are blocks remaining to be erased, erase block tag patterns are generated. Each memory block at a particular sector address has a unique erase block tag pattern to set the erase block latch for that particular memory block. The patterns are transmitted in parallel to the memory devices in a data burst.

24 Claims, 6 Drawing Sheets

MULTIPLE ERASE BLOCK TAGGING IN A FLASH MEMORY DEVICE

TECHNICAL FIELD OF THE INVENTION

The present invention relates generally to memory devices and in particular the present invention relates to erase block tagging in a flash memory device.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Memory devices are typically tested as part of the manufacturing process. This decreases the number of bad parts leaving a manufacturer's facility. As memory devices become more complicated and more densely manufactured, testing per die takes a longer period of time. When this time is multiplied by the large number of dies to be tested, the testing process turns into a significant portion of the manufacturing process. This adds cost to an integrated circuit that is typically being sold at a small profit margin.

Memory devices presently have indicators written to them when they have been erased in order to let a tester know that a particular block on a particular die has been erased. This is referred to in the art as tagging the block. This is accomplished by writing to an individual block on a per die basis. Since each block is typically a megabyte in size and a die may have hundreds of blocks, tagging each die on each block may take a considerable amount of time.

For the reasons stated above, and for other reasons stated below which will become apparent to those skilled in the art upon reading and understanding the present specification, there is a need in the art for a more expeditious way to tag erasure of a memory block.

SUMMARY

The above-mentioned problems with erase block tagging in a memory device and other problems are addressed by the present invention and will be understood by reading and studying the following specification.

The present invention encompasses a method for parallel erase block tagging in a plurality of memory devices. Each memory device has a plurality of memory blocks. The method comprises transmitting an erase pulse to the plurality of memory blocks that are not already erase block tagged. The erase status is determined for the plurality of memory blocks. A parallel erase block tagging data burst is transmitted to the plurality of memory devices. The data burst comprises erase block tag patterns for at least one of the memory devices.

Further embodiments of the invention include methods and apparatus of varying scope.

DETAILED DESCRIPTION

Figure 1:
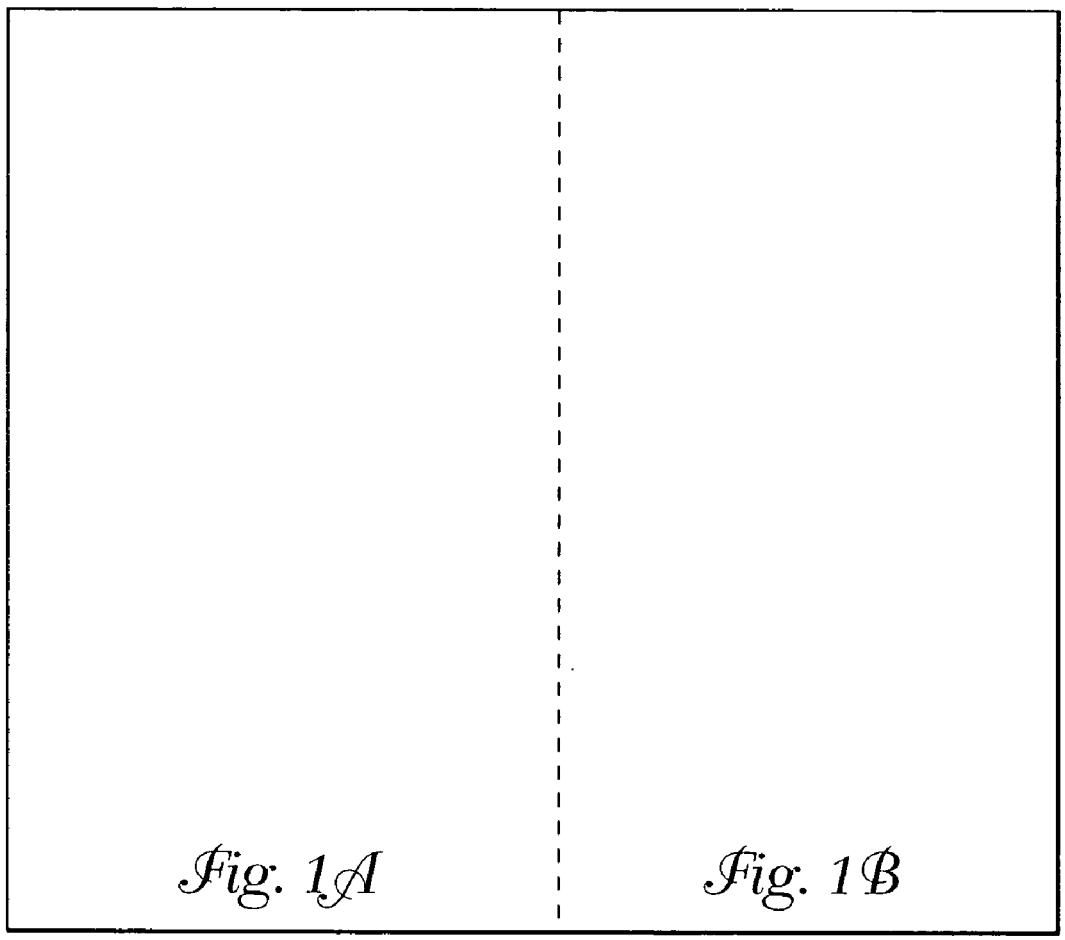
FIG. 1 shows a block diagram of an apparatus for parallel erase block tagging in accordance with one embodiment of the present invention.
Figure 1A:
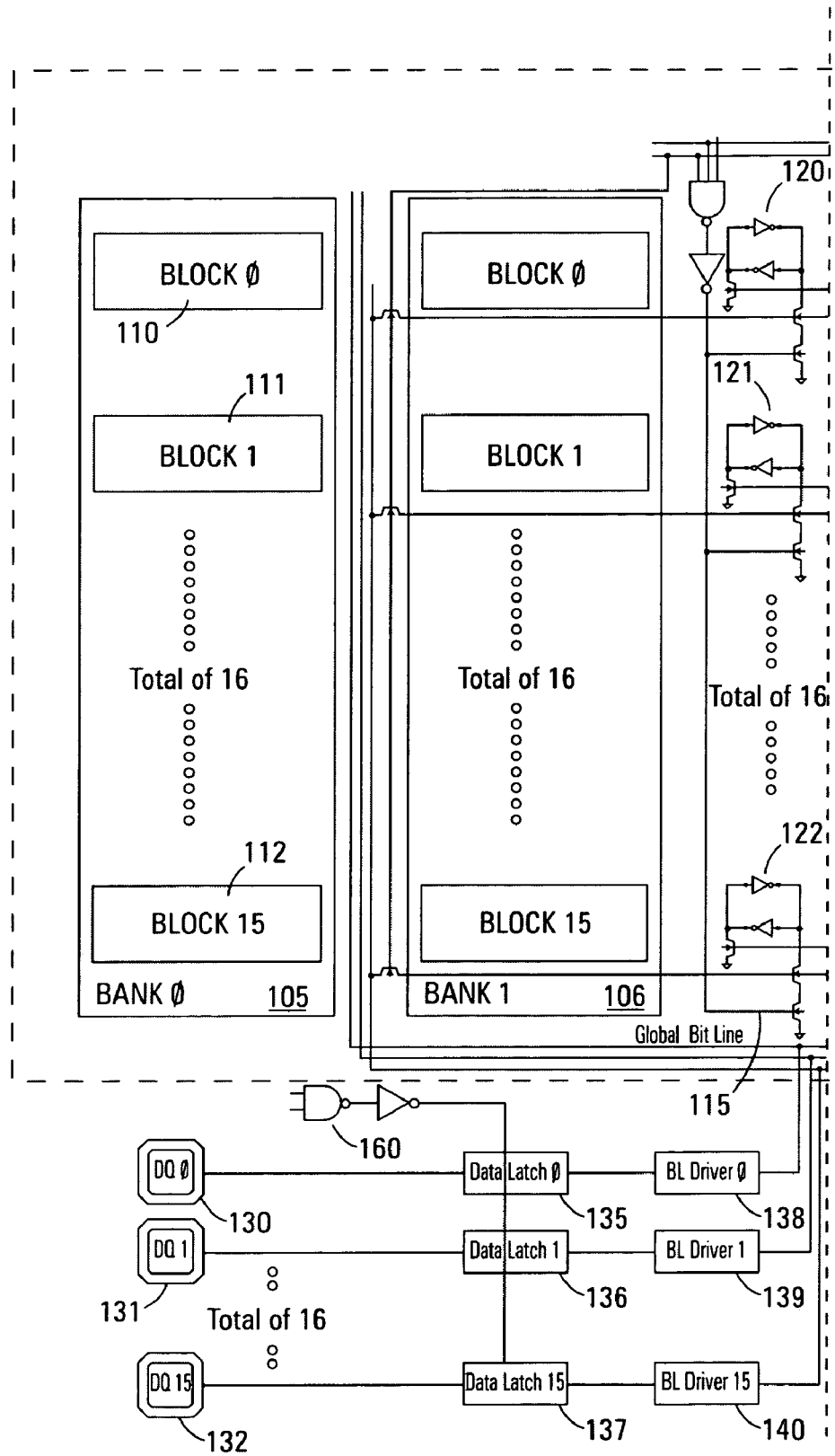
Figure 1B:
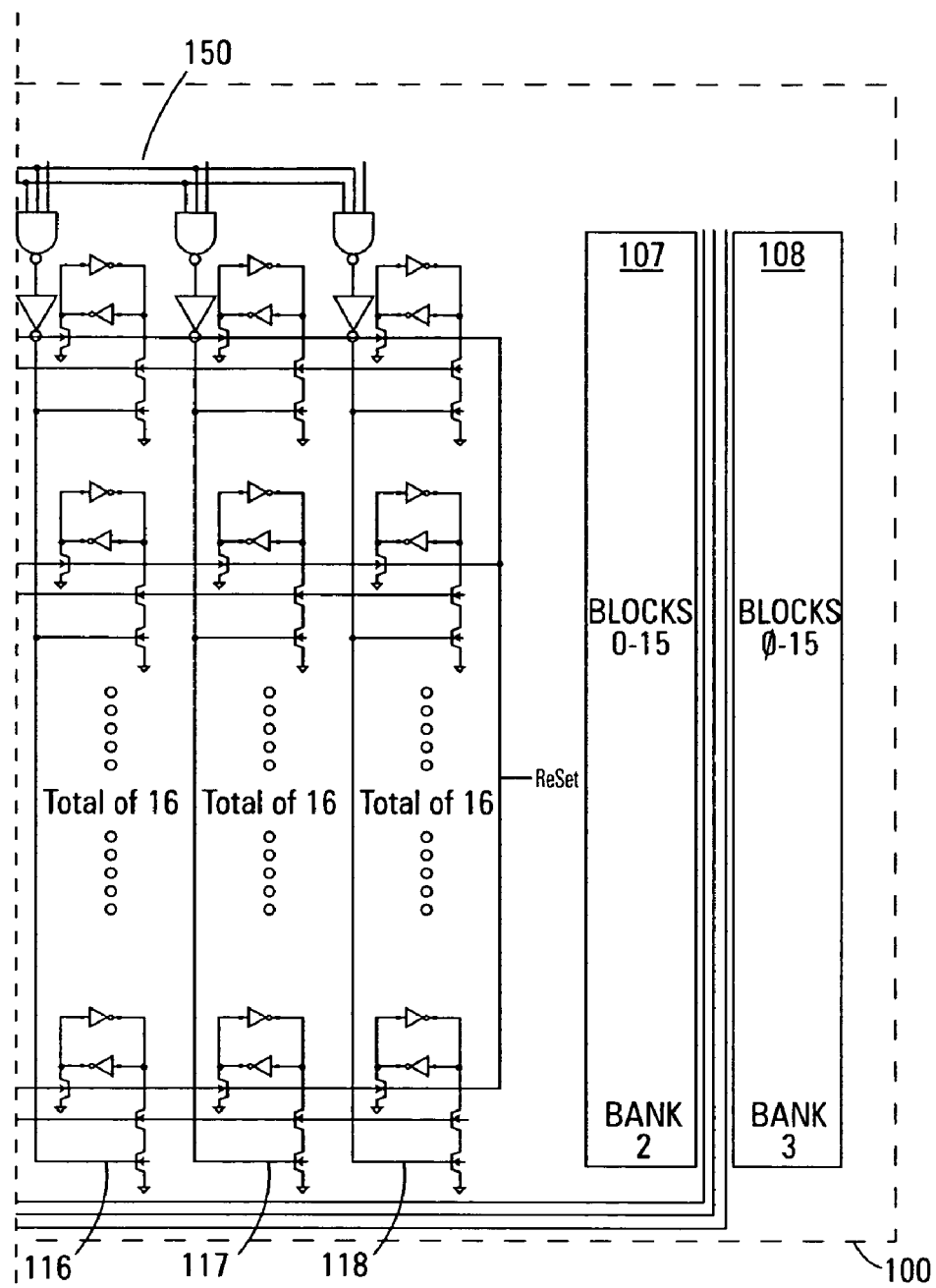

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment of an apparatus for parallel erase block tagging. Such an apparatus may be used for testing purposes or any other embodiment in which parallel erase block tagging is required. For purposes of clarity, FIG. 1 shows only one memory device 100. Alternate embodiments of the apparatus, however, may include testing and writing to multiple memory devices.

The input/output data pins (DQ0–DQ15) 130–132 of the memory device 100 are brought out for use in testing and generally accessing the device 100. The DQ pins 130–132 are each coupled to a data latch 135–137 that latch in data with clocking circuitry 160. The input data is written to the memory device 100 with bit line drivers 138–140. Each data input is coupled to a separate bit line driver 138–140. The circuitry of a bit line driver is well known in the art and is not discussed further.

The bit line drivers 138–140 are coupled to the global bit lines that go to each block of the memory device 100. By using the global bit lines that are present in the memory device instead of adding additional enabling signals, space on the memory die can be saved. The erase block tagging data discussed subsequently can then be passed to the erase blocks through these lines.

The memory device 100 is comprised of four memory banks 105–108. Each memory bank has 16 memory blocks 110–112. Each memory bank 105–108 has a group of erase tag latches 115–118 where each group of latches 115–118 is made up of 16 latches 120–122. There is one latch for each memory block 110–112 in a memory bank 105–108.

Alternate embodiments use other designations besides memory banks for the division of the blocks of memory. The memory banks may be referred to as sectors. Additionally, the sectors may not have the physical division as illustrated in FIG. 1. A sector may have more or less memory blocks than illustrated. The present invention is not limited to any one size of sector.

Write enable circuitry 150 is used to turn on transistors that enable the desired blocks to be tested. Each memory block 110–112 of each memory bank 105–108 can be access individually through the write enable circuitry 150 and accompanying transistors.

Figure 2:
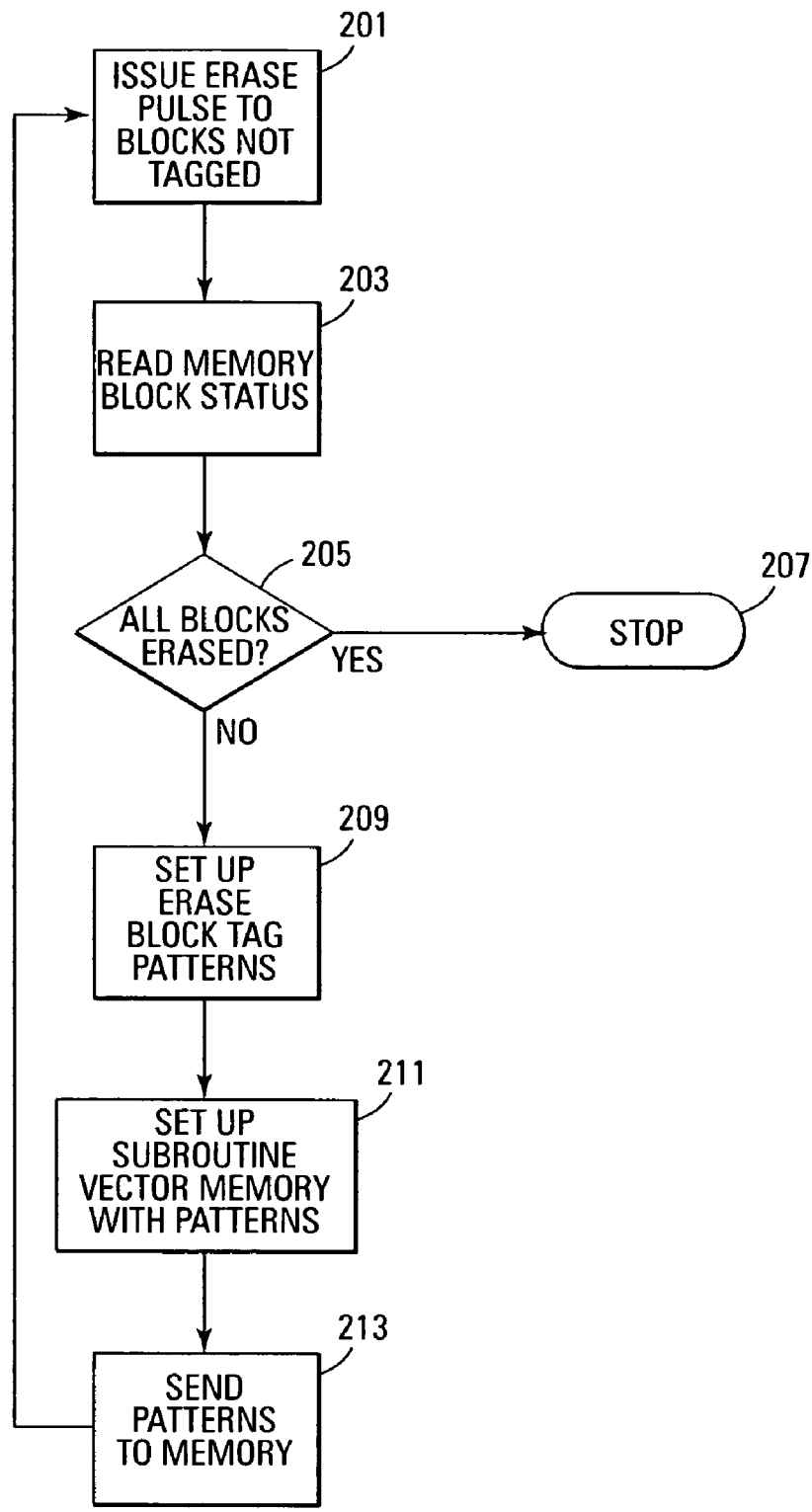
FIG. 2 shows a flowchart of one embodiment of a parallel erase block tagging method of the present invention.

FIG. 2 illustrates a flowchart of one embodiment of a method for parallel erase block tagging. In one embodiment, the memory blocks are already programmed from a previous test operation. In alternate embodiments in which the parallel erase tagging methods of the present invention are not used in a testing environment, the memory blocks may not be programmed.

An initial erase pulse is issued to all the memory blocks 201. In one embodiment, the initial erase pulse is issued only to those memory blocks that are not tagged, if this status is known.

The memory cells of the memory blocks are then read to determine the erase/program status 203 of each block. In one embodiment, a logical one in a cell indicates an erased state for that particular cell. A logical zero in a cell indicates a programmed state. If any one cell in a memory block is still programmed, the block is considered to be still programmed.

If all of the memory blocks have been erased 205, the processing stops 207. If there are still memory blocks that have not been erased 205, the processing goes on to build erase block tag patterns.

The block tag patterns are set up 209 in response to which memories still need erase pulses and which have been erased. The block tag patterns are comprised of a binary pattern of four digits, assuming a memory device has four DQ lines brought out for communication purposes. If the device has a different number of DQ lines brought out, more or less than four blocks can be tagged at once.

If the erase block tagging method of the present invention is used in a test set-up, the erase block tag patterns may be loaded into a subroutine vector memory 211 that stores unique data per test site for the DQ channels. Each test site is a different memory device.

The erase block tag patterns are then sent 213 to the memory or memories. These patterns set the appropriate latches 115–118 as illustrated in FIG. 1. In one embodiment, if a number of erase block patterns are to be transmitted to more than one memory device under test, the patterns can be sent as a data burst to the apparatus for parallel erase block tagging that comprises the multiple memory devices.

The method then repeats by issuing an erase pulse to memory blocks that are not tagged 201. This repeats until all of the memory blocks have been tagged.

Once a memory block has been tagged as erased, that block will not receive an erase pulse. Even if an erase pulse is issued to that particular block, a group of blocks including the tagged block, or a chip erase command is issued, no erase pulse is received.

Figures 3, 4:
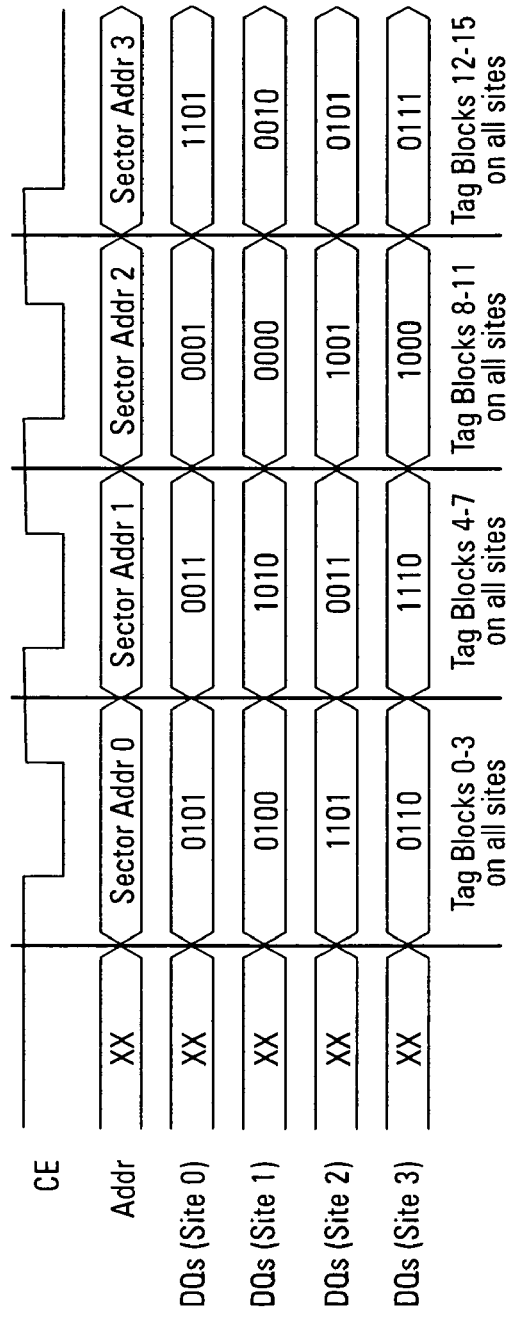
FIG. 3 shows a table of DQ vectors in accordance with one embodiment of operation of the parallel erase block tagging method of FIG. 2.
FIG. 4 shows a timing diagram of a data burst using the DQ vectors of the embodiment of FIG. 3.

FIG. 3 illustrates one embodiment of the operation of the parallel erase block tagging method of the present invention. This figure shows a table of erase block tagging patterns, also known as DQ vectors, for four devices under test (DUT). Such an embodiment might be used with a test apparatus for parallel erase block tagging in which multiple memory devices are written to simultaneously with erase tagging patterns.

As indicated in the left column of this embodiment, sector address 0 encompasses blocks 0–3 of each memory device. Sector address 1 indicates blocks 4–7, sector address 2 indicates blocks 8–11, and sector address 3 indicates blocks 12–15. The sector addresses are also referred to as the Sector Address Vectors. In alternate embodiments, the sector addresses encompass different quantities of memory blocks. The present invention is not limited to any one size of sector.

The DQ Vector section of the table of FIG. 3A illustrates the various unique binary DQ vectors for each memory device under test. In the embodiment of FIG. 3A, there are four devices under test: DUT0–DUT3. Alternate embodiments encompass different quantities of memory devices.

Each device under test is assigned a unique DQ vector for each of its sector addresses. For example, the table shows that in order to erase tag blocks 0–3 (sector address 0) of DUT0, a DQ vector of 0101 is used. DUT1 has a DQ vector of 0100 for the same memory blocks. DUT2 uses 1101 and DUT3 uses 0110 for this block of memory in each memory device. The other erase tag blocks for each memory device under test similarly have unique DQ vectors for each sector address and for each memory device under test.

In testing environment, the DQ vectors of FIG. 3 may be stored in a random access memory of the testing apparatus. In one embodiment, these DQ vectors are converted, by the testing apparatus, to a memory device logical address that are then applied to the memory device under test. In another embodiment, the DQ vectors are applied directly to the memory device under test without conversion such that the memory device can perform any necessary conversions.

FIG. 4 illustrates an example of a timing diagram using the DQ vectors of FIG. 3. The timing diagram is comprised of a chip enable (CE) signal that is active low. Whenever a memory device under test is accessed, the CE signal is brought low.

The address signal includes the sector address for each sector to which a DQ vector of FIG. 3 is written. In this embodiment, the sector addresses include sectors 0–3. Alternate embodiments use other sectors, depending on the number of sectors available.

The DQ vectors for each memory device under test are listed under the sector address. In this embodiment, each memory device is considered a test site and four sites are included (Site 0–3). Alternate embodiments may have different quantities of test sites.

Each sector address occurs simultaneously with the DQ vectors as one 16-bit data burst. The timing diagram shows that multiple memory devices at different sector addresses can be erase tagged in parallel by each data burst. The present invention is not limited to erase block tagging a single block of a single memory device, as performed in the prior art.

In the embodiment of FIG. 4, the first data burst is written to the erase block latches for sector address 0 (blocks 0–3) of each of the four test sites. The second data burst is written to the erase block latches for sector address 1 (blocks 4–7). The third data burst is written to the erase block latches for sector address 2 (blocks 8–11). The fourth data burst is written to the erase block latches for sector address 3 (blocks 12–15).

The parallel erase block tagging method of the present invention is not limited to a test environment. The data bursts may be written to one or more memory devices.

One embodiment of the parallel erase block tagging method of the present invention also provides for clearing or setting the erase block tags with one command. In this embodiment, all of the sector addresses are set to a logical low level. The chip enable signal or a clock signal, as seen subsequently with reference to FIG. 4, is then toggled. All of the blocks of a device would then be tagged as erased. A second clock signal would then toggle this tag indication and untag all blocks. If the embodiment is in a test environment and multiple devices are being tested, this scenario could be extended such that all of the devices under test would be tagged or untagged, depending on its previous state.

The simultaneous tagging and untagging can also be accomplished with an address other than all logic zeros. For example, an unused address combination may be used.

Figure 5:
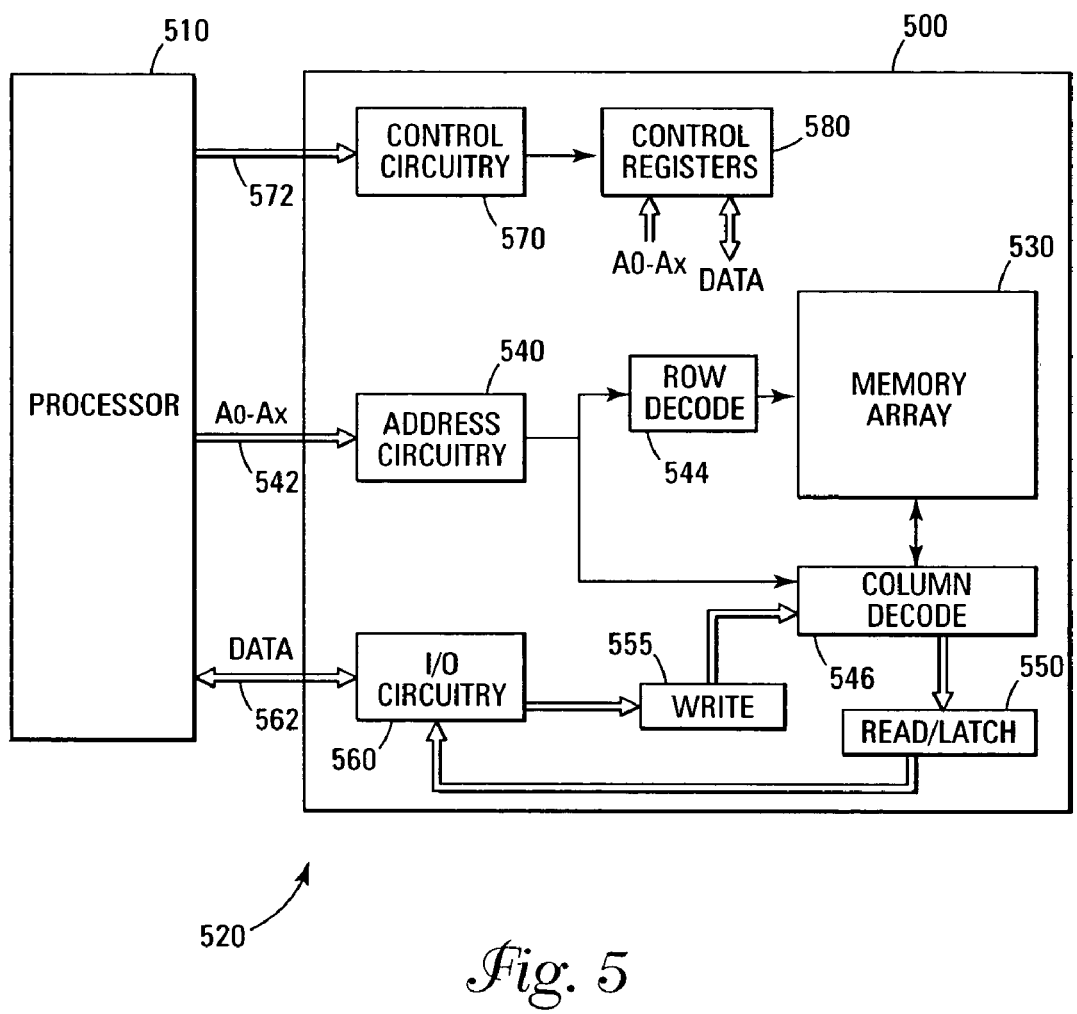
FIG. 5 shows a block diagram of one embodiment of an electronic system of the present invention.

FIG. 5 illustrates a functional block diagram of a memory device 500 of one embodiment of the present invention. In one embodiment, the memory device is a flash memory device. However, the embodiments of the present invention are not limited to any one type of memory technology. For example, the circuits and methods of the present invention may be implemented in a NOR–type flash memory device, a NAND-type flash memory device, or any other type memory device that can be constructed with a memory array.

In the embodiment of FIG. 5, a flash memory device 500 is coupled to a processor circuit 510. The processor circuit 510 may be a microprocessor, a processor, or some other type of controlling circuitry. The memory device 500 and the processor 510 form part of an electronic system 520. The electronic system 520 may be a testing system where the processor 510 is the tester and the flash memory device 500 is one of a number of memory devices that are under test by the processor 510.

The memory device includes an array of memory cells 530. The memory cells are non-volatile floating-gate memory cells and the memory array 530 is arranged in banks of rows and columns.

An address buffer circuit 540 is provided to latch address signals provided on address input connections A0–Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/latch circuitry 550. The sense/latch circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. In one embodiment, the control circuitry 570 executes the methods of the present invention.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the parallel erase block tagging method and apparatus of the present invention provides the ability to erase tag and untag memory device blocks in a parallel fashion. This greatly increases the speed at which a number of memory devices can be erased and then erase block tagged.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for parallel erase block tagging a plurality of memory devices each having a plurality of memory blocks, the method comprising:
    transmitting an erase pulse to each of the plurality of memory blocks of each memory device, wherein only those blocks that are not erase block tagged receive the erase pulse;
    determining a memory erase block status for the plurality of memory blocks of each memory device; and
    transmitting a parallel erase block tagging data burst to the plurality of memory devices, the data burst comprising erase block tag patterns for a plurality of blocks in at least one of the memory devices such that a tagged memory block cannot received the erase pulse.

2. The method of claim 1 wherein determining a memory block status comprises reading each memory cell in a memory block.

3. The method of claim 1 wherein writing the parallel erase block tagging data burst to the plurality of memory devices comprises writing a portion of the data burst to a first erase block latch in the at least one memory device.

4. The method of claim 3 wherein the portion of the data burst is converted to a logical address of the first erase block latch.

5. The method of claim 3 and further including continuing to transmit erase pulses to the plurality of memory blocks until all of the erase block latches indicate that the plurality of memory blocks of each of the plurality of memory devices are erased.

6. A method for parallel erase block tagging a plurality of memory devices each having a plurality of memory blocks including a plurality of memory cells, each memory block having an erase block latch, the method comprising:
    transmitting an erase pulse to each of the plurality of memory blocks of each memory device, wherein only those blocks that are not erase block tagged receive the erase pulse;
    reading the plurality of memory cells to determine the memory erase block status for each of the plurality of memory blocks; and
    transmitting a parallel erase block tagging data burst to the plurality of memory devices, the data burst comprising a plurality of erase block tag patterns, each tag pattern for tagging a plurality of memory blocks of each memory device such that the tagged memory blocks cannot receive an erase pulse, each erase block tag pattern indicating which of the erase block latches to set in response to the memory erase block status.

7. The method of claim 6 and further including programming the plurality of memory blocks prior to transmitting the erase pulses.

8. The method of claim 6 wherein the plurality of memory devices are flash memory devices.

9. The method of claim 8 wherein the plurality of flash memory devices are NAND flash memory devices.

10. The method of claim 8 wherein the plurality of flash memory devices are NOR flash memory devices.

11. A method for parallel erase block tagging a plurality of memory devices in a testing apparatus, each memory device having a plurality of memory blocks organized into sectors and including a plurality of memory cells, each memory block having an erase block latch, the method comprising:

transmitting an erase pulse to each of the plurality of memory blocks of each memory device, wherein only those blocks that are not erase block tagged receive the erase pulse;

reading the plurality of memory cells to determine the memory erase block status for each of the plurality of memory blocks;

if at least one memory block is still programmed, generating an erase block tag pattern for each memory block still programmed;

generating a plurality of data bursts, each data burst comprised of erase block tag patterns for a predetermined sector address;

transmitting the plurality of data bursts in parallel to the plurality of memory devices such that a plurality of memory blocks of each memory device are tagged, each erase block tag pattern indicating which of the erase block latches to set in response to the memory erase block status; and setting the erase block latches in response to the erase block tag patterns.

12. The method of claim 11 and further including translating each erase block tag pattern received in a data burst to a logical address for a predetermined memory device.

13. An apparatus for parallel erase block tagging comprising:

a plurality of memory devices, each memory device comprising a plurality of memory blocks, each memory block having an erase block tag latch that prevents erase pulses transmitted to a particular memory block from being received by the memory block;

a plurality of data input/output lines coupled to the plurality of memory devices; and a processor coupled to the plurality of data input/output lines for controlling testing operations of the plurality of memory devices, the processor capable of generating data bursts comprising a plurality of erase block tag patterns that are transmitted to a plurality of memory blocks of each of the plurality of memory devices in parallel.

14. The apparatus of claim 13 and further including a plurality of bit line drivers, each bit line driver coupled between a data input/output line and a memory device.

15. The apparatus of claim 14 and further including a plurality of data latches, each data latch coupled between a data input/output and a bit line driver.

16. The apparatus of claim 13 wherein the plurality of memory devices are capable of decoding a received erase block tag pattern from a data burst into a logical address corresponding to an erase block tag latch.

17. The apparatus of claim 13 and further including a plurality of bit line drivers coupled to global bit lines of the memory device such that the plurality of erase block tag patterns are transmitted to the plurality of erase block latches over the global bit lines.

18. The apparatus of claim 13 wherein each of the plurality of memory devices is capable of setting, substantially simultaneously, a first erase block tag latch in response to a received erase block tag pattern.

19. An electronic system for parallel erase block tagging of memory devices, the system comprising:

a plurality of memory devices, each memory device comprising a plurality of memory blocks, each memory block having an associated erase block tag latch that prevents erase pulses transmitted to a particular memory block from being received by the memory block;

a plurality of data input/output lines coupled to the plurality of memory devices; and a processor coupled to the plurality of data input/output lines for controlling testing operations of the plurality of memory devices, the processor capable of transmitting an erase pulse to the plurality of memory blocks that are not erase block tagged, determining a memory erase block status for the plurality of memory blocks, and transmitting a parallel erase block tagging data burst substantially simultaneously to a plurality of memory blocks of each of the plurality of memory devices, the data burst comprising erase block tag patterns for setting an associated erase block tag latch in the plurality of the memory devices.

20. The system of claim 19 wherein an erase block tag latch is set when it has a logic high state.

21. A method for parallel erase block tagging a plurality of memory devices each having a plurality of memory blocks including a plurality of memory cells, each memory block having an erase block latch, the method comprising:

transmitting an erase pulse to each of the plurality of memory blocks of each memory device, wherein only those blocks that are not erase block tagged receive the erase pulse;

reading the plurality of memory cells to determine the memory erase block status for each of the plurality of memory blocks; and transmitting a parallel erase block tagging data burst to a plurality of memory blocks of each of the plurality of memory devices, the data burst comprising a plurality of erase block tag patterns each having an equivalent logical state such that when the plurality of memory devices receive the erase block tag patterns, the erase block latches are set to a predetermined state.

22. The method of claim 21 wherein the predetermined state is an erased state.

23. The method of claim 21 wherein the predetermined state is an unerased state.

24. The method of claim 21 wherein the equivalent logical state is a logic low.

* * * * *